(12) United States Patent
Meyerson et al.

(10) Patent No.: US 11,402,308 B2
(45) Date of Patent: Aug. 2, 2022

(54) FREEZABLE FLUID CELL FOR CRYO-ELECTRON MICROSCOPY

(71) Applicant: BRANDEIS UNIVERSITY, Waltham, MA (US)

(72) Inventors: Joel Meyerson, Waltham, MA (US); Jungwon Park, Waltham, MA (US)

(73) Assignee: Brandeis University, Waltham, MA (US)

( * ) Notice: Subject to any disclaimer, the term of this patent is extended or adjusted under 35 U.S.C. 154(b) by 436 days.

(21) Appl. No.: 16/466,860

(22) PCT Filed: Dec. 6, 2017

(86) PCT No.: PCT/US2017/064831
§ 371 (c)(1),
(2) Date: Jun. 5, 2019

(87) PCT Pub. No.: WO2018/106761
PCT Pub. Date: Jun. 14, 2018

(65) Prior Publication Data
US 2020/0064241 A1    Feb. 27, 2020

Related U.S. Application Data

(60) Provisional application No. 62/430,666, filed on Dec. 6, 2016.

(51) Int. Cl.
*H01J 37/20* (2006.01)
*G01N 1/42* (2006.01)
(Continued)

(52) U.S. Cl.
CPC ........... *G01N 1/42* (2013.01); *G01N 23/2204* (2013.01); *G01N 23/2251* (2013.01);
(Continued)

(58) Field of Classification Search
None
See application file for complete search history.

(56) References Cited

U.S. PATENT DOCUMENTS

2007/0134699 A1    6/2007  Glover, III et al.
2008/0137969 A1*   6/2008  Rueckert ............. G06K 9/6234
                                                    382/224
(Continued)

FOREIGN PATENT DOCUMENTS

CN    102866034 A    1/2013
CN    104162458 A    11/2014
(Continued)

OTHER PUBLICATIONS

European Patent Office. Extended European Search Report for application 17878807.1. dated Oct. 8, 2020.
(Continued)

*Primary Examiner* — Daniel S Larkin
(74) *Attorney, Agent, or Firm* — Quarles & Brady LLP

(57) ABSTRACT

A system and method for imaging a biological sample using a freezable fluid cell system is disclosed. The freezable fluid cell comprises a top chip, a bottom chip, and a spacer to control the thickness of a vitrified biological sample. The spacer is positioned between the top chip and the bottom chip to define a channel that is in fluid communication with an inlet port and an exit port to the freezable fluid cell system. The channel can be filled with a biological sample, vitrified, and imaged to produce high-resolution electron microscopic image.

23 Claims, 7 Drawing Sheets

(51) Int. Cl.
  *G01N 23/04* (2018.01)
  *G01N 23/225* (2018.01)
  *G01N 23/2204* (2018.01)
  *G01N 23/2251* (2018.01)

(52) U.S. Cl.
  CPC ....... *H01J 37/20* (2013.01); *H01J 2237/2004* (2013.01); *H01J 2237/223* (2013.01)

(56) References Cited

U.S. PATENT DOCUMENTS

| | | | |
|---|---|---|---|
| 2008/0179518 A1 | 7/2008 | Creemer et al. | |
| 2011/0006208 A1* | 1/2011 | Freitag | G01N 23/2251 250/307 |
| 2012/0182548 A1 | 7/2012 | Harb et al. | |
| 2012/0298883 A1 | 11/2012 | Grogan et al. | |
| 2013/0009072 A1 | 1/2013 | Chen et al. | |
| 2013/0316365 A1* | 11/2013 | van Donselaar | G01N 1/42 435/7.1 |
| 2014/0070095 A1 | 3/2014 | Schoenmakers et al. | |
| 2015/0118126 A1 | 4/2015 | Khalid et al. | |
| 2016/0351374 A1 | 12/2016 | Wang | |
| 2017/0213692 A1* | 7/2017 | Yu | H01J 37/16 |

FOREIGN PATENT DOCUMENTS

| | | |
|---|---|---|
| CN | 105492621 A | 4/2016 |
| EP | 2316565 A1 | 5/2011 |
| EP | 2444157 A1 | 4/2012 |
| WO | 2008010718 A2 | 1/2008 |
| WO | 2015134575 A1 | 9/2015 |

OTHER PUBLICATIONS

Carroni, M. et al. "Cryo electron microscopy to determine the structure of macromolecular complexes." Methods 95 (2016): 78-85.

Kukulski, W., et al. "Correlated fluorescence and 3D electron microscopy with high sensitivity and spatial precision." Journal of Cell Biology 192.1 (2011): 111-119.

Ponce, C. et al. "Computing steerable principal components of a large set of images and their rotations." IEEE Transactions on Image Processing 20.11 (2011): 3051-3062.

Schwartz, C. L., et al. "Cryo-fluorescence microscopy facilitates correlations between light and cryo-electron microscopy and reduces the rate of photobleaching." Journal of microscopy 227.2 (2007): 98-109.

PCT International Search Report and Written Opinion, PCT/US2017/064831, dated Mar. 1, 2018, 13 pages.

Arnold, et al., Blotting-Free and Lossless Cryo-Electron Microscopy Grid Preparation from Nanoliter-Sized Protein Samples and Single-Cell Extracts, Journal of Structural Biology, 2016, Article in Press, 7 pages.

Crucifix, et al., Immobilization of Biotinylated DNA on 2-D Streptavidin Crystals, Journal of Structural Biology, 2004, 146:441-451.

De Jonge, et al., Electron Microscopy of Whole Cells in Liquid with Nanometer Resolution, PNAS, 2009, 106(7):2159-2164.

Fernandez-Leiro, et al., Unravelling Biological Macromolecules with Cryo-Electron Microscopy, Nature, 2016, 537:339-346.

Gilmore, et al., Visualizing Viral Assemblies in a Nanoscale Biosphere, Lab on a Chip, 2013, 13:216-219.

Glaeser, How Good Can Cryo-EM Become?, Nature Methods, 2016, 13(1):28-32.

Han, et al., Electron Microscopy of Biotinylated Protein Complexes Bound to Streptavidin Monolayer Crystals, Journal of Structural Biology, 2012, 180:249-253.

Liao, et al., Real-Time Imaging of Pt3Fe Nanorod Growth in Solution, Science, 2012, 336:1011-1014.

Park, et al., Direct Observation of Nanoparticle Superlattice Formation by Using Liquid Cell Transmission Electron Microscopy, Acs Nano, 2012, 6(3):2078-2085.

Park, et al., 3D Structure of Individual Nanocrystals in Solution by Electron Microscopy, Science, 2015, 349(6245):290-295.

Passmore, et al., Specimen Preparation for High-Resolution Cryo-EM, Methods in Enzymology, 2016, 579:51-86.

Razinkov, et al., A New Method for Vitrifying Samples for CryoEM, Journal of Structural Biology, 2016, Accepted Manuscript, 23 pages.

Ring, et al., Silicon Nitride Windows for Electron Microscopy of Whole Cells, Journal of Microscopy, 2011, 243(3):273-283.

Russo, et al., Controlling Protein Adsorption on Graphene for Cryo-EM Using Low-Energy Hydrogen Plasmas, Mature Methods, 2014, 11(6):649-652.

Russo, et al., Progress Towards an Optimal Specimen Support for Electron Cryomicroscopy, Current Opinion in Structural Biology, 2016, 37:81-89.

Wang, et al., Liposomes on a Streptavidin Crystal: A System to Study Membrane Proteins by Cryo-EM, Methods in Enzymology, 2010, 481:147-164.

Zheng, et al., Nanocrystal Diffusion in a Liquid Thin Film Observed by In Situ Transmission Electron Microscopy, Nano Letters, 2009, 9(6):2460-2465.

European Patent Office. Partial Supplementary European Search Report for application 17878807.1. dated Jun. 15, 2020.

Evans et al., Visualizing Macromolecular Complexes with In Situ Liquid Scanning Transmission Electron Microscopy, Micron, 2012, 43(11):1085-1090.

China National Intellectual Property Administration, First Office Action and Search Report, Application No. 201780075756.4, dated Apr. 30, 2021, 29 pages.

* cited by examiner

FREEZABLE FLUID CELL FOR CRYO-ELECTRON MICROSCOPY

CROSS-REFERENCE TO RELATED APPLICATIONS

This application represents the U.S. National Stage of International Application No. PCT/US2017/064831, filed Dec. 6, 2017 which is based on, claims the benefit of, and incorporates herein by reference, U.S. Provisional Patent Application 62/430,666, filed Dec. 6, 2016.

STATEMENT REGARDING FEDERALLY SPONSORED RESEARCH

Not applicable.

TECHNICAL FIELD

This disclosure relates to cryo-electron microscopy and improved fluid cells for holding samples for cryo-electron microscopy.

BACKGROUND

Cryo-electron microscopy ("cryo-EM") is an imaging technique performed on thin films of vitrified aqueous samples. Cryo-EM is gaining popularity in structural biology, and has made it possible to observe the architecture of cells, viruses and protein assemblies in their native state at molecular resolution. Cryo-EM is based upon the principle of imaging radiation-sensitive specimen in a transmission electron microscope under cryogenic conditions and high vacuum.

Plunge-freezing aqueous solutions into a cryogen, such as liquid ethane, is a common method used to prepare specimens for cryo-EM applications. Freezing samples at cryogenic temperatures reduces the extent of radiation damage that is caused to the biological sample. Specifically, electron irradiation leads to the breaking of chemical bonds and the creation of free radicals which, in turn, causes further damage to the sample. The development of the method to rapidly freeze or vitrify biological samples in thin-frozen layers allows for the reduction in radiation damage and for samples to be imaged with a higher radiation dose. Additionally, preserving the biological samples at cryogenic temperatures allows for the preservation of the biological sample under a high vacuum.

SUMMARY OF THE INVENTION

Disclosed herein is a system and method for imaging a biological sample using a freezable fluid cell for cryo-electron microscopy. As used herein, the term "biological sample" refers to a variety of macromolecule assemblies including, but not limited to, protein molecules, small peptides, individual bacteria, viruses, intact tissue sections, and plunge-frozen cells. In the disclosed methodology, an aqueous droplet containing a biological sample is introduced into an inlet port of the freezable fluid cell, in which the biological sample is pulled into the device by capillary action. The biological sample is then pulled into a thin, planar fluid cell regime within the cell. The freezable fluid cell is then rapidly cooled to immobilize the biological sample in a thin film of ice, which may alternatively be referred as a vitrified biological sample. The thin film can then be imaged using cryo-electron microscopy.

Previous approaches for imaging cryo-EM samples used robotic blotting methods for creating thin, vitrified biological samples which were often poorly controlled. That is, robotic blotting methods typically include depositing a few microliters of a purified protein solution onto a metal (usually copper) grid, on top of which lies a thin film of amorphous carbon configured with holes. A portion of the protein solution enters the holes of the amorphous carbon grid, and the remaining solution is blotted away using filter paper prior to plunge freezing in liquid ethane. These previous blotting methods resulted in frozen samples with variable ice thicknesses due to large air-liquid interfaces, and concentration gradients of the macromolecule assemblies. The variable ice thicknesses and concentration gradients necessitated time intensive manual screening of the vitrified biological sample to locate suitable regions for imaging. Furthermore, the variable ice thickness associated with previous blotting methods results in inconsistent background noise signals across the sample. Inconsistent background noise signals complicates data post processing and image reconstruction. This sample preparation stage of cryo-EM is widely considered the bottleneck in structure determination and an obstacle to automation of structure determination.

The present disclosure addresses the aforementioned shortcomings by providing a freezable fluid cell to define the ice thickness of the biological sample. The present disclosure also removes the air-liquid interface that has been largely unavoidable using robotic blotting methods, which can be problematic in three-dimensional structure determination. By removing the air-liquid interface and plunge freezing the biological sample within a planar fluid cell regime, the present disclosure addresses the problem of variable ice thickness and poor macromolecule distribution.

The present disclosure also facilitates the automation process. Previous methods hindered automation for high-resolution cryo-EM imaging because traditional blotting and plunge freezing systems create ice thickness that varies across the substrate surface. This necessitates manual intervention to find areas that are sufficiently thin to obtain high-resolution information, yet not so thin that proteins are excluded from the ice. For example, thick ice diminishes signal, but if ice is too thin proteins will be pushed away. The present disclosure facilitates automation because it creates ice of customized and uniform ice thickness that also accommodates the proteins. As a consequence, a computer controlled imaging system can move from point to point acquiring images and the images will be of consistent quality because the ice thickness is constant. Further, the present disclosure also facilitates the automation process through a regular array of imaging windows.

According to one aspect, the present disclosure provides a freezable fluid cell system for cryo-electron microscopy. The freezable fluid cell system comprises a top chip and a bottom chip. The top chip includes a first structural member joined to a first electron transparent member. The bottom chip includes a second structural member joined to a second electron transparent member. The freezable fluid cell also includes a spacer positioned between the top chip and the bottom chip in which the spacer joins the top chip and the bottom chip to define one or more channels between the first electron transparent member and the second electron transparent member. The top chip further includes one or more inlet ports and outlet ports that extend through the first structural member and the first electron transparent member such that the inlet port, the outlet port, and the channel are in fluid communication. The inlet port and the exit port allow the freezable fluid cell device to be used and reused without disassembly of the device.

Suitable materials for the first and second electron transparent members may include silica, silicon nitride, silicon carbide, graphene, or derivatives thereof that are deposited onto the respective first or second structural member. It is contemplated that use of graphene or silicon carbide may improve the image resolution by reducing the noise present in the system.

In some forms, the first and second electron transparent members each may have a thickness that is 150 nm or less. In some non-limiting examples, the thickness may range between 2 nm to 100 nm, or may range between 2 nm to 75 nm, or may range between 2 nm to 50 nm, or may range between 2 nm to 40 nm, or may range between 2 nm to 30 nm, or may range between 2 nm to 20 nm, or may range between 2 nm to 10 nm, or may range between 2 nm to 5 nm. It is also contemplated the thickness of the first and second electron transparent members may approach an atomic thickness when using materials, such as, but not limited to graphene. The atomic thickness may be less than 2 nm, for example, the thickness may range between 0.4 nm to 1.7 nm, which is approximately the thickness of a single layer of graphene. The thickness for first and second electron transparent members does not have to be the same.

In some forms, the first and second structural members may each comprise silicon and may each have a thickness of 500 µm or less. In some non-limiting examples, the thickness of the first and second structural support members may range between 10 and 200 µm, or between 20 and 180 µm, or between 30 and 170 µm, or between 40 and 160 µm, or between 50 and 150 µm. Moreover, each of the first and second structural members may contain a plurality of trapezoidal recesses that extend through the respective one of the first or structural member to form respective first and second imaging windows on the surface of the respective first and second electron transparent member. The first and second imaging windows may each have an area that is less than 10 mm$^2$. In one non-limiting example, the area of the imaging windows may be between 1 and 20 µm$^2$.

In some forms, the spacer may comprise silicon oxide, indium, or microparticle beads and may have a thickness of 2 µm or less. In some non-limiting examples, the thickness of the spacer 108 for cell biology applications may benefit from having the thickness of the spacer be around 1 µm, while high-resolution protein imaging benefits from the thickness of the spacer 108 being around 20 nm. In some configurations, the thickness of the spacer 108 may be between 20 nm and 1 µm. In a preferred configuration, thickness of the spacer 108 may be between 20 and 200 nm. In the case of indium, the thermal and electrical conductivity of indium may facilitate charge dissipation during imaging.

According to another aspect, the present disclosure also provides a method for imaging a biological sample using cryo-electron microscopy. A biological sample is deposited into the inlet channel of the freezable fluid cell system described above (which may have any of the various workable permutations in structure described herein) with the biological sample filling the total volume within the channel. The biological sample is then frozen to produce a vitrified biological sample. An electron beam is directed through the first electron transparent member, the vitrified biological sample, and the second electron transparent member. A collection of images are acquired and collectively processed using statistical methods.

In some forms, the statistical methods may include principal component analysis, multivariate analysis, or covariance analysis.

In some forms, the method may further include the steps of acquiring a series of images at different tilts relative to the direction of the incident electron beam, processing the images through an imaging filter, and computationally combining the images to produce tomograms and a three-dimensional image of the vitrified biological sample.

In some forms, the step of directing an electron beam and processing the image may further include, acquiring a series of images using a fluorescent microscope, locating the position of fluorescent biological samples, and merging the data from the fluorescent images with the cryo-EM images such that the fluorescent biological samples are identifiable within the cryo-EM images.

In some forms, the biological sample may include an aqueous solution further containing one or more virus, protein molecule, bacteria, or tissue samples.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Referring first to FIGS. 1A, 1B, 1C, and 2, one exemplary embodiment of a freezable fluid cell system 100 according to the present disclosure is shown. The freezable fluid cell system 100 comprises a top chip 102, a spacer 108, and a bottom chip 110. In each of FIGS. 1A, 1B, and 1C, a top view along with a respective pair of cross sectional side views for each section (top, bottom, spacer) of the freezable fluid cell system 100 is illustrated.

Figure 1A:
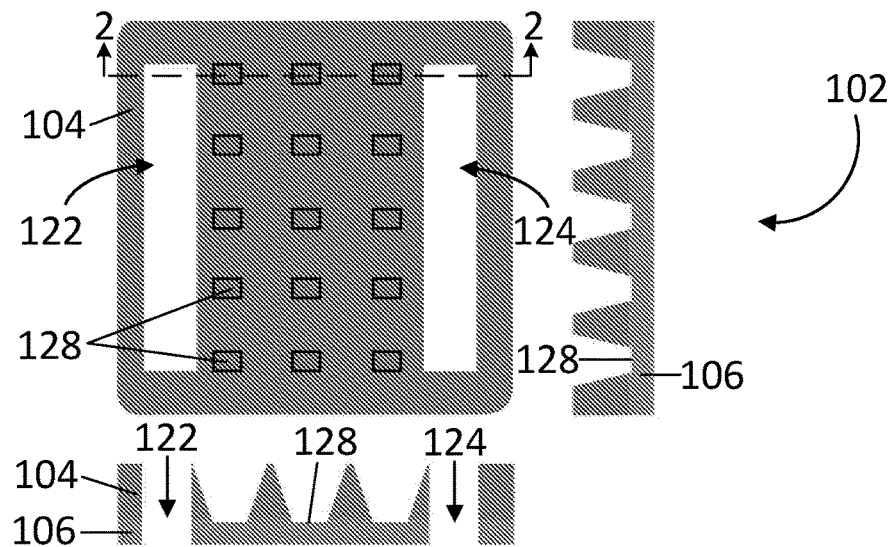
FIG. 1A shows top and cross-sectional views of a top chip for a freezable fluid cell system.

In FIG. 1A, the top chip 102 of a freezable fluid cell system 100 is shown. The top chip 102 includes a first structural member 104 joined to a first electron transparent member 106. The top chip 102 has at least one inlet port 122 and at least one exit port 124 that extends through the first structural member 104 and the first electron transparent member 106 such that at least one channel 134 within the spacer 108 (described in more detail below and show in FIGS. 1B and 2) can remain in fluid communication with the inlet port 122 and the exit port 124. The top chip 102 also includes one or more imaging windows 128 that extend through the first structural member 104 to an exposed or uncovered section of the first electron transparent member 106.

Figure 1B:
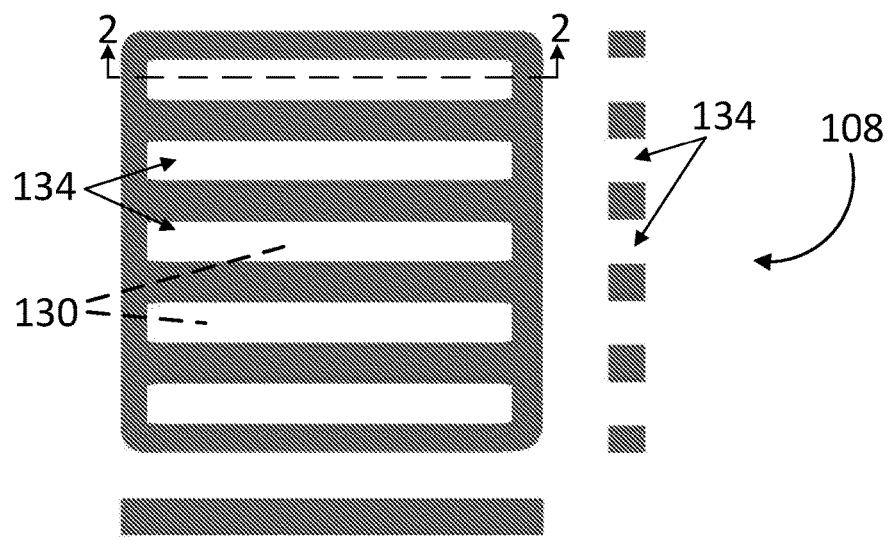
FIG. 1B shows top and cross-sectional views of a spacer for the freezable fluid cell system.
Figure 1C:
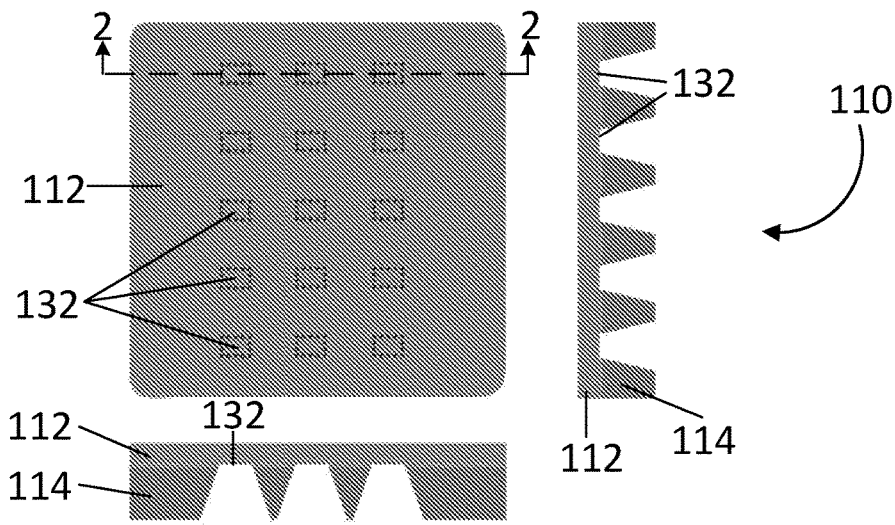
FIG. 1C shows top and cross-sectional views of a bottom chip for the freezable fluid cell system.

Turning to FIG. 1C, the bottom chip 110 is shown. Similar to the top chip 102, the bottom chip 110 has a second structural member 114 and a second electron transparent member 112. The second electron transparent member 112 joins the bottom chip 110 to the spacer 108. The bottom chip 110 also has one or more imaging windows 132 that extend through the second structural member 114 to an exposed or uncovered section of the first electron transparent member 112. The imaging windows 128, 132 may include side walls that are vertical or that have an inward slope.

Figure 2:
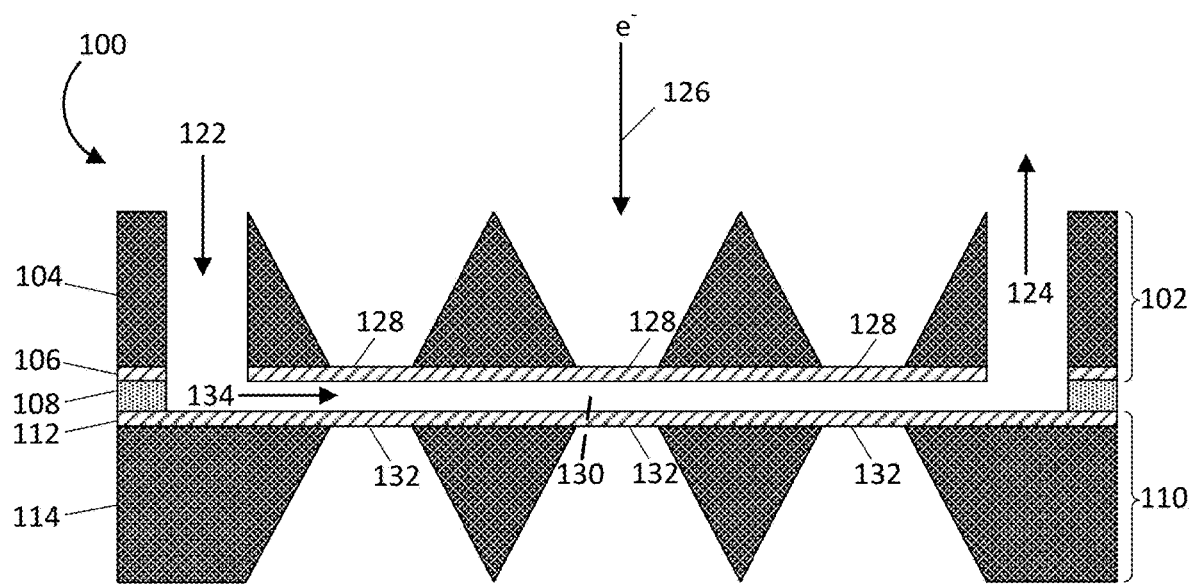
FIG. 2 shows a representative cross-sectional side view of an assembled freezable fluid cell system taken along 2-2 in FIGS. 1A, 1B, and 1C.

Now with reference to FIGS. 1B and 2, the spacer 108 is positioned between the top chip 102 and the bottom chip 110, with the spacer 108 providing structural support, joining the top chip 102 with the bottom chip 110, and defining a space therebetween. As illustrated, the spacer 108 has a plurality of openings formed therein that, along with the top chip 102 and bottom chip 110, defines one or more channels 134 into which the biological sample 130 can be drawn into the freezable fluid cell system 100 by capillary forces through the inlet port 122. The biological sample 130 may then be frozen to establish a thin, vitrified film. After imaging and thawing of the sample, the sample may then be removed from the at least one channel 134 within the spacer 108 through the exit port 124 to be reused.

As best illustrated in FIG. 2, during cryo-EM imaging, the electron beam 126 produced by a cryo-EM device will initially be directed through one or more of imaging windows 128 in the top chip 102, pass through the frozen sample 130, pass through one or more of imaging windows 132, and be received by or collected one or more detectors. Data collected by the detector includes two-dimensional projections of biological molecules configured within the biological sample 130. Relative orientations of the individual particles can be determined by processing the two-dimensional projections using a computer to produce an image, i.e., a two-dimensional or three-dimensional structure of the biological molecule in the biological sample 130. The two-dimensional projections may be combined into a three-dimensional reconstruction through the use of computer hardware and software using methods known to those skilled in the art.

During imaging of a biological sample 130, the most relevant sources of background noise within the freezable fluid cell system 100 can be attributed to the ice thickness, the first electron transparent member 106, and the second electron transparent member 112. The background noise within the freezable fluid cell system 100 therefore depends on the thickness and composition of each of these members.

In some forms, the first electron transparent member 106 and the second electron transparent member 112 can comprise a compound having a crystalline lattice. For example, the first electron transparent member 106 may comprise silicon nitride, silicon carbide, graphene, silica, derivatives or mixtures thereof. Silicon carbide offers advantages because the background noise associated with silicon carbide can be computationally reduced in reciprocal space during post-processing. This is due to the characteristic solid crystalline lattice of silicon carbide. This offers benefits over silicon nitride, which contains an amorphous solid phase, whose background noise cannot be conveniently removed in post-processing steps. Similarly, graphene also exhibits a crystalline lattice, allowing for the background noise to be reduced in post-processing steps. Graphene also has an atomic thickness, and therefore contributes negligibly to background noise during image processing. In other configurations, the first electron transparent layer 106 and the second electron transparent layer 112 could include other allotropes of carbon such as graphite, charcoal, carbon nanotubes, and fullerenes. The first electron transparent layer 106 and the second electron transparent layer 112 may also be coated with a thin film. Suitable thin film include, but are not limited to, silicon nitride coatings.

In some configurations, the electron transparent members 106, 112 may have a thickness that is 150 nm or less. As mentioned above, the thickness of the electron transparent members 106, 112 are significant contributors to background noise and reduction of their thickness while maintaining the structural integrity of the freezable fluid cell system 100 can help reduce noise. In other configurations, the thickness of the electron transparent members 106, 112 may range between 2 nm to 100 nm, or may range between 2 nm to 75 nm, or may range between 2 nm to 50 nm, or may range between 2 nm to 40 nm, or may range between 2 nm to 30 nm, or may range between 2 nm to 20 nm, or may range between 2 nm to 10 nm, or may range between 2 nm to 5 nm. It is also contemplated the thickness of the first and second electron transparent members may approach an atomic thickness when using materials, such as, but not limited to graphene. The atomic thickness may be less than 2 nm, for example, the thickness may range between 0.4 nm to 1.7 nm, which is approximately the thickness of a single layer of graphene. The thickness for each of the electron transparent members 106, 112 does not have to be the same. The first and second imaging windows 128, 132 may each have an area that is less than 10 mm$^2$. In one non-limiting example, the area of the imaging windows may between 1 and 20 μm$^2$.

It is to be appreciated that the term "electron transparent" as used herein does not require the electron transparent members to be 100% transparent. Rather, any material that permits an adequate proportion of the electron beam 126 to pass through the electron transparent members to allow for an image to be acquired may be used.

Suitable materials for the first structural support member 104 and the second structural support member 114 may include silicon, silicon dioxide, gold, derivatives or mixtures thereof. The thickness of the structural support members 104 and 114 may be 500 µm or less. In some non-limiting examples, the thickness of the structural support members 104 and 114 may range between 10 and 200 µm, or between 20 and 180 µm, or between 30 and 170 µm, or between 40 and 160 µm, or between 50 and 150 µm. In other configurations, suitable materials for the structural support members 104, 114 may comprise a synthetic organic or inorganic polymer such as, but not limited to polyethylene, polypropylene, polyvinyl chloride, polystyrene, nylon, Teflon, thermoplastic polyurethanes, and derivatives thereof.

In some configurations, suitable materials for the spacer 108 may comprise silicon oxide, aluminum oxide, aluminum silicate, gallium, or indium. In one particular configuration, the spacer 108 comprises silicon dioxide or indium. Indium can offer several advantages over silicon dioxide. First, indium has a suitable electrical conductivity that can facilitate charge dissipation during imaging. Second, indium has a higher density and provides improved structural integrity for the freezable fluid cell system 100. Third, the low temperature thermal evaporation of indium simplifies the patterning of indium and its thickness control onto the bottom chip during manufacturing.

As mentioned above, the thickness of the spacer 108 defines and ultimately corresponds to the thickness of the vitrified biological sample 130, which thickness contributes to the background noise within the freezable fluid cell system 100. Accordingly, it is desirable to minimize the thickness of the spacer 108 while maintaining structural integrity. However, it is to be appreciated that different biological imaging applications benefit from different thicknesses of the spacer 108. In some forms, the thickness of the spacer may be 2 µm or less. In some non-limiting examples, the thickness of the spacer 108 for cell biology applications may benefit from having the thickness of the spacer be around 1 µm, while high-resolution protein imaging benefits from the thickness of the spacer 108 being around 20 nm. In some configurations, the thickness of the spacer 108 may be between 20 nm and 1 µm. In a preferred configuration, thickness of the spacer 108 may be between 20 and 200 nm.

Figure 4A:
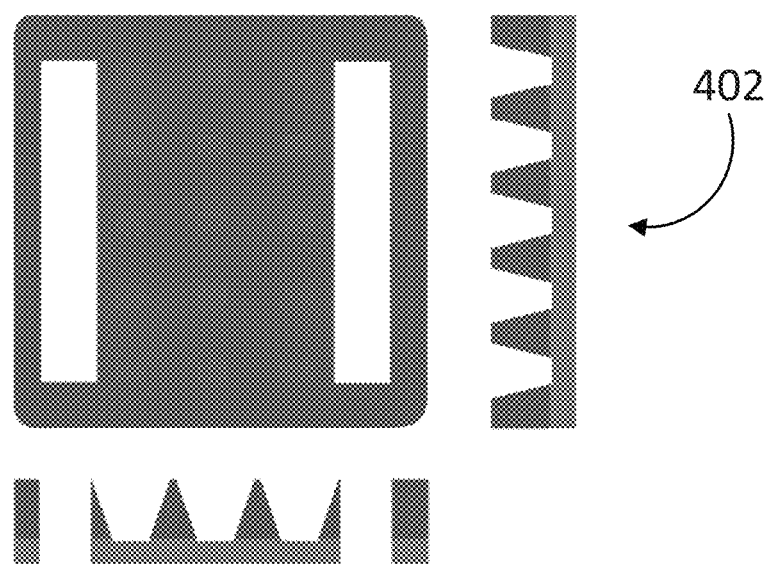
FIG. 4A shows top and cross-sectional views of a top chip for a freezable fluid cell system.
Figure 4B:
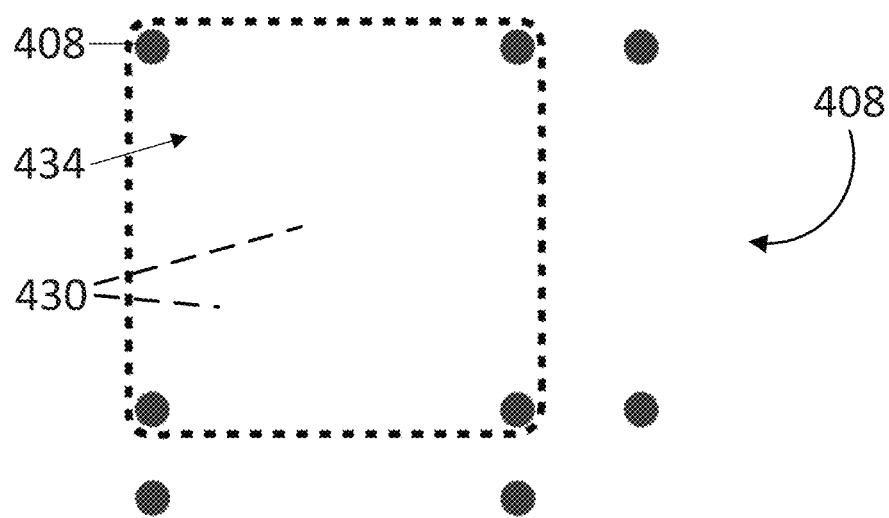
FIG. 4B shows top and cross-sectional views of a spacer for the freezable fluid cell system.
Figure 4C:
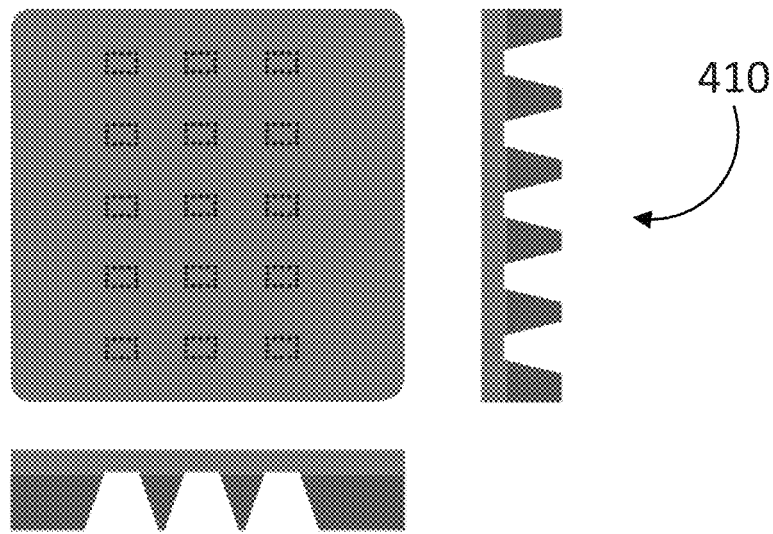
FIG. 4C shows top and cross-sectional views of a bottom chip for the freezable fluid cell system.

In some forms, the spacer 108 may comprise microparticle beads 408 as depicted in FIGS. 4A, 4B, and 4C. This embodiment parallels the freezable fluid cell 100 disclosed in FIGS. 1A, 1B, and 1C. In this configuration, the microparticle beads 408 are positioned such that each of the four corners of the top chip 402 and bottom chip 410 are joined by the microparticle beads 408. Similar to above, the microparticle beads 408 may be made of silicon oxide, aluminum oxide, aluminum silicate, gallium, or indium. In this configuration, the microparticle beads 408 do not cover the entire periphery between top chip 402 and bottom chip 410. Therefore, the interior space 434 of the freezable fluid cell device 400 for encapsulating the biological sample 430 will have an open interface to air along four sidewalls with a thickness defined by the microparticle beads. In this configuration, the biological sample 430 is loaded by capillary action along the open interfaces.

In one aspect, the microparticle beads 408 do not bond the top chip 402 to the bottom chip 410, rather the microparticle beads are placed in the corners of the bottom chip 410 followed by the placement of the top chip 402 on top of the microparticle beads 408 to assemble the freezable fluid device 400. This allows for the freezable fluid device 400 to be disassembled and for each of the components to be easily washed between trials. Microparticle beads 408 can be particularly advantageous for certain biological samples 430. In particular, the open interface allows air to be in contact with the biological sample 430, which allows cells to grow inside of the freezable fluid cell device 400. In this case, cells are seeded inside of the freezable fluid cell device 400 and immersed in cell culture media. The open interface then allows for nutrients in the cell culture media to diffuse into the freezable fluid chamber to enable the cells to grow. Once the cells are sufficiently grown, the device is removed and plunge frozen for imaging as described above.

Figure 3A:
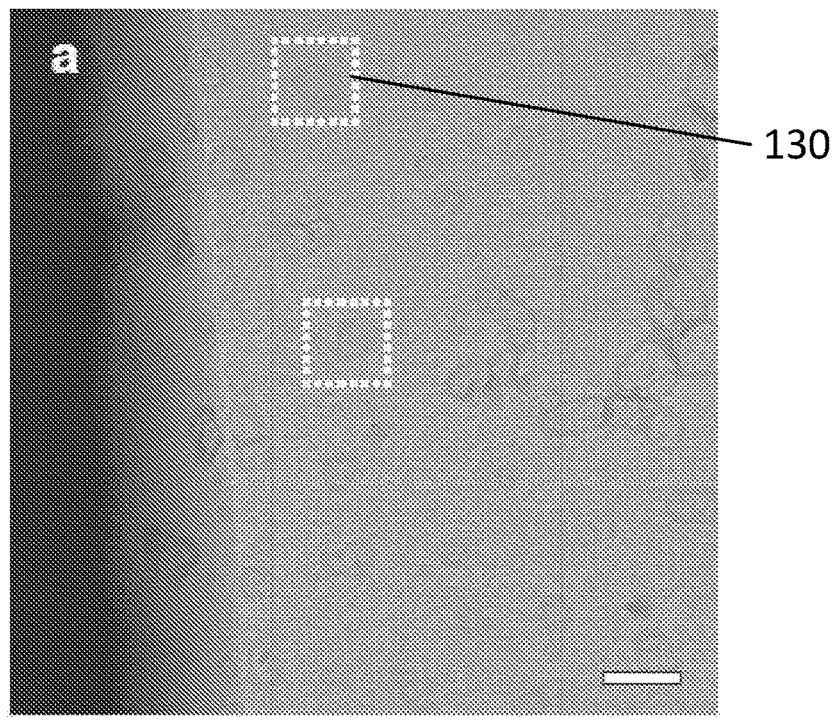
FIG. 3A shows an image of vesicular material from rotovirus VLP preparation taken from the freezable fluid cell system. The scale bar of the image is approximately 100 nm.
Figure 3B:
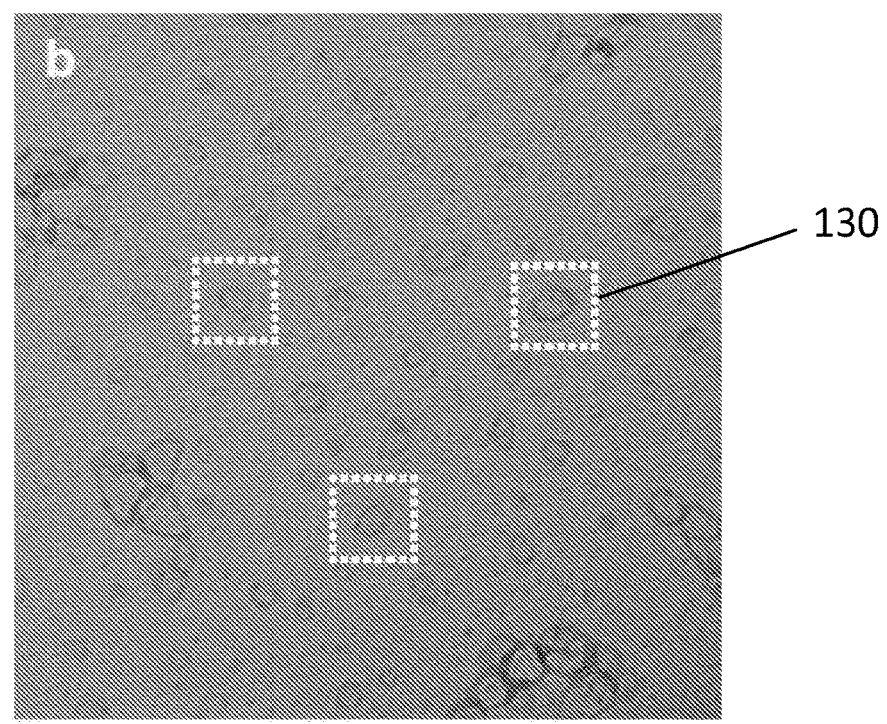
FIG. 3B shows another image of vesicular material from rotovirus VLP preparation taken from the freezable fluid cell system.

With reference to FIG. 3, a non-limiting image of the biological sample 130 taken with the freezable fluid cell system 100 is shown. Specifically, FIG. 3 shows a vesicular material observed in a rotavirus VLP preparation, imaged with the freezable fluid cell system 100 after plunge freezing in liquid ethane. An advantageous aspect of the freezable fluid cell system 100 is that the uniformly defined ice layer formed upon freezing the fluid cell, and high contrast at the first imaging window 128 edge (i.e. where the first electron transparent member 106 overlaps with tapered edge of the first structural member 104) makes the device amenable to automated data collection. Automation is currently used in cryo-EM, but high-resolution work is hampered because resulting data is of inconsistent quality owing to lack of uniformity in the ice layer on standard cryo-EM systems.

In addition to unimodal cryo-EM imaging of cells and proteins, the freezable fluid cell system 100 could be used for multimodal correlative imaging with fluorescence light microscopy and cryo-EM. For example, the freezable fluid cell system 100 could be populated with a mixture of fluorescent and non-fluorescent proteins, frozen, and then imaged with a fluorescent microscope to localize the fluorescent proteins. Cryo-EM imaging could then be done, and then data from both imaging modalities merged to identify the fluorescent molecules in the cryo-EM image data (i.e. cryo-EM data does not capture fluorescence but can be augmented with data from the fluorescent light microscope). Alternatively, this same approach could be adopted with cells expressing fluorescent proteins of interest. After protein localization with the fluorescent microscope, the proteins could be localized in the electron microscope and micrographs or tomograms acquired.

The present disclosure also pertains to a method of using the freezable fluid cell system 100 to image a biological sample 130 using cryo-EM. First, the biological sample 130 is deposited into the inlet port 122 of the freezable fluid cell system 100. The biological sample 130 is deposited such that it fills the total volume of one or more channels 134 of the spacer 108. The freezable fluid cell system 100 is then cooled to produce a vitrified biological sample 130. The vitrified biological sample is formed such that it is of uniform thickness along the length of one or more channels 134, and so that no air interface exists between the vitrified biological sample 130 and either of the electron transparent members 106, 112. Next, an electron beam is directed through the first electron transparent member 106, the vitrified biological sample 130, and the second electron transparent member 112. Finally, the image is processed using statistical methods.

In some configurations, cooling the biological sample 130 involves plunge freezing into a cryogen, such as liquid ethane cooled by liquid nitrogen. Alternatives to the cryogen could include liquid propane. The methods disclosed above are not limited to two-dimensional imaging, but could include three-dimensional imaging. To collect three-dimensional images of the biological sample 130, a series of images are collected, with each image taken at a different tilt relative to the direction of the incident electron beam 126. Images are then combined computationally, to generate tomograms. Averaging methods can then be employed to obtain more detailed structural information. If the structure is morphologically heterogeneous, multiple tomograms may be used to identify patterns in structural variation.

Figure 5:
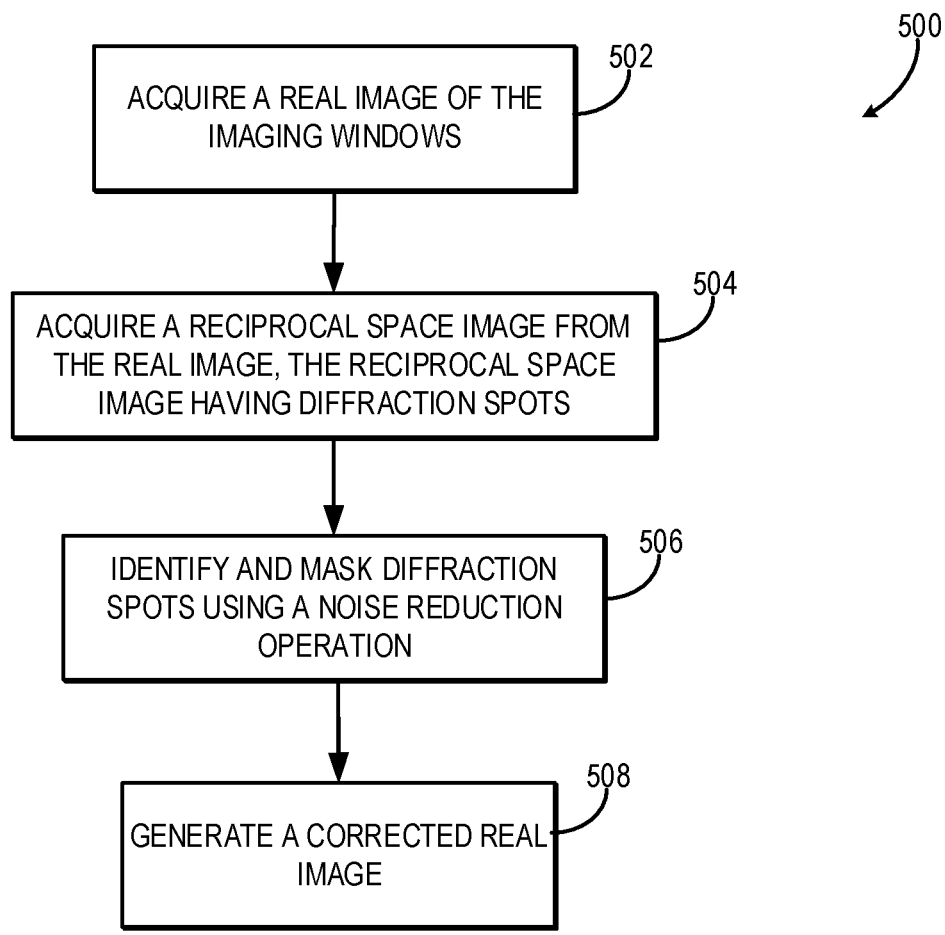
FIG. 5 shows a schematic flow chart illustrating one non-limiting example of a method for reducing noise associated with a crystalline lattice in imaging windows of the freezable fluid cell.

In some forms, imaging the biological sample 130 using cryo-EM includes a method 500 for reducing noise associated with the crystalline lattice of the imaging windows 128, 132. Referring to FIG. 5, the method 500 includes acquiring a real space image 502, i.e. a TEM image, of the imaging windows 128, 132 in the freezable fluid cell system 100. A reciprocal space image 504 is then produced from the real space image by applying, for example, a Fourier transform or a diffraction pattern analysis, such as, but not limited to, a Gatan program or the like. The reciprocal space image 504 comprises diffraction spots associated with the crystalline lattice of the imaging windows 128, 132 that may be identified and masked using a noise reduction operation 506. The noise reduction operation 506 may include, for example, employing Gaussian shaped soft-edged masks in reciprocal space to suppress certain frequency ranges.

Figure 6:
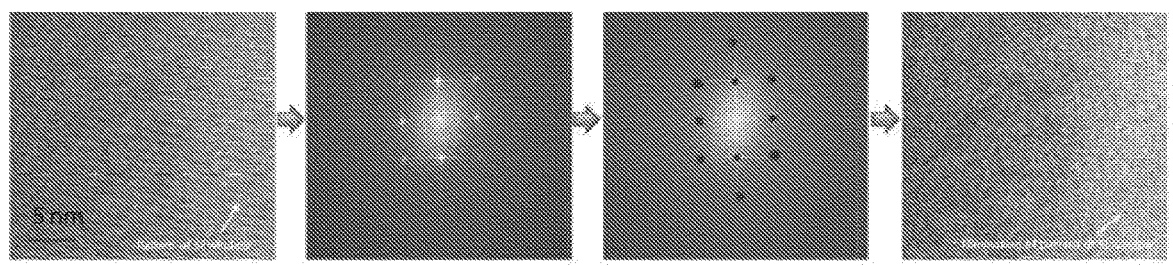
FIG. 6 shows one non-limiting example of using the method of FIG. 5 on a single crystal silicon imaging window. The following is shown: a real space image of the single crystal silicon imaging window (left), a reciprocal space image with diffraction spots (left middle), masks over the diffraction spots (right middle), and a corrected real image of the single crystal silicon imaging window with improved contrast (right).

A corrected real image 508 is then generated from the masked reciprocal space image by, for example, taking the inverse Fourier transform of the masked reciprocal space image. To further illustrate the method 500, FIG. 6 shows one non-liming example of reducing noise associated with a crystalline lattice in a single crystal silicon imaging window. The single crystal silicon imaging window illustrated in FIG. 6 has a thickness of 35 nm, and is deposited on a silicon structural member having a 100 μm thickness. A real space image of the single crystal silicon imaging window (left) is shown taken from a <1-0-0> orientation for diffraction studies. FIG. 6 further illustrates a reciprocal space image with diffraction spots evident (left middle). The reciprocal space image is generated from the real space image using a fast Fourier transform diffraction pattern analysis with Gatan programing. Diffraction patterns of the single crystal silicon imaging window are identified and masked as shown in FIG. 6 (right middle). A corrected real space image (right) is then generated by applying an inverse fast Fourier transform to reduce the signal associated with the single crystal silicon imagine window. Reducing the noise associated with the crystalline lattice of the imaging window produces a real image with improved contrast.

Figure 7:
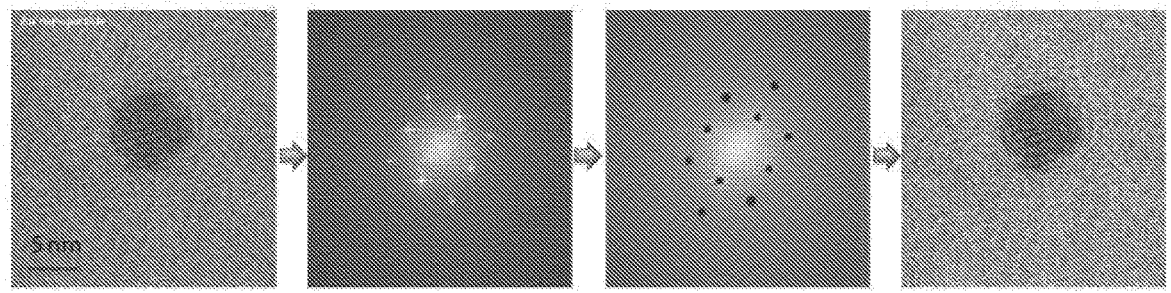
FIG. 7 shows one non-limiting example of using the method of FIG. 5 on a single crystal silicon imaging window having a gold nanoparticle in a imaging channel. The following is shown: a real space image of the single crystal silicon imaging window and the gold nanoparticle (left), a reciprocal space image with diffraction spots (left middle), masks over the diffraction spots (right middle), and a corrected real image of the single crystal silicon imaging window and the gold nanoparticle with improved contrast (right).

FIG. 7 illustrates another non-limiting example of reducing noise associated with a crystalline lattice in a single crystal silicon imaging window having a gold nanoparticle in the imaging channel. The single crystal silicon imaging window illustrated in FIG. 7 has a thickness of 35 nm, and is deposited on a silicon structural member having a 100 μm thickness. A real space image of the single crystal silicon imaging window and the gold nanoparticle (left) is shown taken from a <1-0-0> orientation for diffraction studies. FIG. 7 further illustrates a reciprocal space image with diffraction spots evident (left middle). The reciprocal space image is generated from the real space image using a fast Fourier transform diffraction pattern analysis with Gatan programing. Diffraction patterns of the single crystal silicon imaging window are identified and masked as shown in FIG. 7 (right middle). A corrected real space image (right) is then generated by applying an inverse fast Fourier transform to reduce the signal associated with the single crystal silicon imagine window. The corrected real space image (right) includes improved contrast over the real space image (left).

Although FIGS. 6-7 illustrate a method for reducing noise associated with the crystalline lattice of a single imaging window; however, the method 500 could be performed on a freezable fluid cell system 100 having a first imaging window 128 and a second imaging window 132. That is, background noise attributed to the crystalline lattice of both imaging windows 128, 132 could be reduced simultaneously by identifying and masking independent diffraction patterns using a method similar to the one described above.

Figure 8:
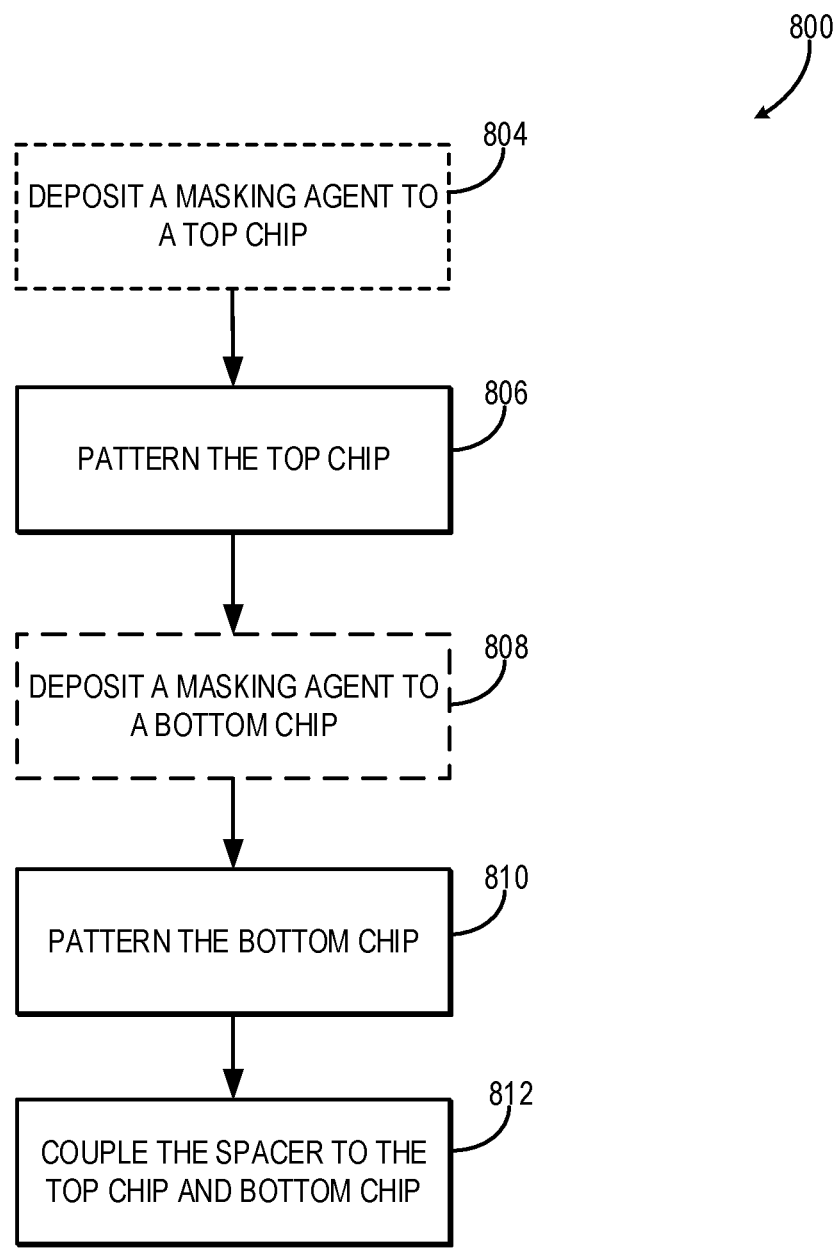
FIG. 8 shows a schematic flow chart illustrating one non-limiting example of a method to fabricate the freezable fluid cell system

Referring to FIG. 8 a flowchart is provided for one implementation of a method 800 for fabricating a freezable fluid cell system 100 in accordance with the present disclosure, for example from a top chip 102 and a bottom chip 110. Initially during fabrication, the top chip 102 and the bottom chip 110 may be provided as substantially planar substrates having multiple layers. For example, as described above, the top chip 102 may include a first structural member 104 joined to a first electron transparent member 106, and the bottom chip 110 may include a second structural member 114 joined to a second electron transparent member 112.

The method 800 further includes patterning the top chip 806 to form an inlet port 122, an exit port 124, and a first imaging window 128 in the first structural member 104 and the first electron transparent member 106. In some aspects, the method 800 includes an optional step of depositing a masking agent 804 onto portions of the top chip 102, i.e. the first structural member 104 and the first electron transparent member 106, to protect regions of interest during etching. As used herein, a "masking agent" refers to a material that may be photo-resistant or chemical-resistant to etching agents. Suitable masking agents for the present disclosure include durable materials such as silicon nitride and derivatives thereof.

Suitable patterning techniques for the present disclosure may include photolithography, dry etching, wet etching, or similar techniques known in the art to etch portions of a thin film from a bulk substrate. In one non-limiting example, wet etching techniques such as buffered oxide etching (BOE) or tetramethylammonium hydroxide (TMAH) are performed to pattern regions of interest on the substrate. Suitable deposition techniques for the present disclosure may include chemical deposition and physical deposition methods. Non-limiting deposition methods may include, for example, chemical vapor deposition (CVD), atomic layer deposition (ALD), physical vapor deposition (PVD), sputtering, or similar methods.

The method 800 further includes patterning the bottom chip 810 to form a second imaging window 132 in the second structural member 114. Similar to above, patterning the bottom chip 810 may include an optional step of depositing a masking agent 808 onto portions of the bottom chip 110, i.e. the second structural member 114 and the second electron transparent member 112, to protect regions of interest during etching. After patterning, a spacer 108 may be deposited 810 onto either the top chip 102 or the bottom chip 110. In one non-limiting example, the spacer 108 may be deposited onto the first electron transparent member 106 or the second electron transparent member 112. After deposition, the method 800 further includes coupling the spacer 812 to the top chip 102 and the bottom chip 110 to form a channel 134 in fluid communication with the inlet port 122 and the exit port 124. As used herein, "coupling" may refer to chemically bonding the spacer 108 to the top chip 102 and the bottom chip 110, or it may refer to placing the spacer 108 into contact with the top chip 102 and the bottom chip 110.

It should be appreciated that various other modifications and variations to the preferred embodiments can be made within the spirit and scope of the invention. Therefore, the invention should not be limited to the described embodiments. To ascertain the full scope of the invention, the following claims should be referenced.

We claim:

1. A freezable fluid cell system configured for cryo-electron microscopy, the freezable fluid cell system comprising:
   a top chip comprising a first structural member joined to a first electron transparent member, the first structural member including one or more imaging windows that extend through the first structural member to an exposed surface of the first electron transparent member;
   a bottom chip comprising a second structural member joined to a second electron transparent member, the second structural member including one or more imaging windows that extend through the second structural member to an exposed surface of the second electron transparent member; and
   a spacer positioned between the top chip and the bottom chip, wherein the spacer joins the top chip and the bottom chip to define a channel between the first electron transparent member and the second electron transparent member, wherein the spacer consists of indium;
   wherein the top chip further comprises an inlet port and an outlet port that extends through the first structural member and the first electron transparent member such that the inlet port, the outlet port, and the channel are in fluid communication.

2. The freezable fluid cell system of claim 1, wherein:
   the first electron transparent member has a thickness between 2 nm to 20 nm; and
   the second electron transparent member has a thickness between 2 nm to 20 nm.

3. The freezable fluid cell system of claim 1, wherein:
   the first electron transparent member comprises a crystalline lattice structure; and
   the second electron transparent member comprises a crystalline lattice structure.

4. The freezable fluid cell system of claim 3, wherein:
   the first electron transparent member comprising at least one of silica, silicon nitride, silicon carbide, and graphene deposited onto the first structural member; and
   the second electron transparent member comprising at least one of silica, silicon nitride, silicon carbide, and graphene deposited on the second structural member.

5. The freezable fluid cell system of claim 1, wherein:
   the first structural member comprises silicon; and
   the second structural member comprises silicon.

6. The freezable fluid cell system of claim 5, wherein:
   the first structural member has a thickness between 10 μm and 200 μm; and
   the second structural member has a thickness between 10 μm and 200 μm.

7. The freezable fluid cell system of claim 6, wherein:
   the first structural member contains a plurality of trapezoidal recesses that extend through the first structural member to form a first imaging window on the surface of the first electron transparent member; and
   the second structural member contains a plurality of trapezoidal recesses that extend through the second structural member to form a second imaging window on the surface of the second electron transparent member.

8. The freezable fluid cell system of claim 7, wherein:
   the first imaging window has an area between 1 and 20 $\mu m^2$; and
   the second imaging window has an area between 1 and 20 $\mu m^2$.

9. The freezable fluid cell system of claim 1, wherein:
   the thermal and electrical conductivity of indium facilitates charge dissipation during imaging.

10. The freezable fluid cell system of claim 1, wherein:
    the spacer has a thickness between 20 and 200 nm.

11. A method for imaging a biological sample using cryo-electron microscopy, the method comprising:
    (a) depositing a biological sample into the inlet port of the freezable fluid cell system of claim 1, wherein the biological sample fills the total volume within the channel;
    (b) freezing the biological sample to produce a vitrified biological sample; and
    (c) directing an electron beam through the first electron transparent member, the vitrified biological sample, and the second electron transparent member to produce an image indicative of the biological sample.

12. The method of claim 11, wherein step (c) further comprises
    (d) acquiring a collection of images; and
    (e) processing the collection of images using statistical methods to produce a three-dimensional image of the vitrified biological molecule.

13. The method of claim 12, wherein:
    the statistical methods comprise principal component analysis, multivariate analysis, or covariance analysis.

14. The method of claim 11 wherein step (c) further comprises:
    acquiring a series of images at different tilts relative to the direction of the incident electron beam;
    processing the images through an imaging filter; and
    computationally combining the images to produce tomograms and a three-dimensional image of the vitrified biological sample.

15. The method of claim 11 wherein step (c) further comprises:
    acquiring a series of images using a fluorescent microscope;
    locating the position of fluorescent biological samples; and
    merging the data from the fluorescent images with cryo-EM images, wherein the fluorescent biological samples are identifiable within the cryo-EM images.

16. The method of claim 11, wherein:
    the biological sample consists of an aqueous solution further containing one or more virus, protein molecule, bacteria, or tissue sample.

17. The freezable fluid cell of claim 1, wherein the spacer has a plurality of openings formed therein that, along with the top chip and bottom chip, define a plurality of channels that are in fluid communication with the inlet port and the exit port.

18. The freezable fluid cell of claim 1, wherein the spacer comprises a microparticle bead.

19. A method of fabricating a freezable fluid cell system for cryo-electron microscopy, the method comprising:
    (a) patterning a top chip to form an inlet port, an exit port, and a first imaging window, the top chip having a first structural member and a first electron transparent member joined thereto, the inlet port and the exit port extending through the first structural member and the first electron transparent member, the first imaging window extending through the first structural member to an exposed surface of the first electron transparent member;

(b) patterning a bottom chip to form a second imaging window, the bottom chip having a second structural member and a second electron transparent member joined thereto, the second imaging window extending through the second structural member to an exposed surface of the second electron transparent member; and (c) coupling the top chip and the bottom chip together to form a channel in fluid communication with the inlet port and the exit port;

wherein a spacer is situated between the top chip and the bottom chip and is coupled to both of the top chip and the bottom chip, and wherein the spacer consists of indium.

20. The method of claim 19, wherein the method further comprises the step of depositing the spacer onto at least one of the first electron transparent member and the second electron transparent member to couple the spacer thereto.

21. The method of claim 19, wherein:
depositing the spacer is performed using a technique selected from chemical deposition or physical deposition.

22. The method of claim 19, wherein steps (a-b) further comprise:
depositing a masking agent onto at least a portion of the first structural member prior to forming the inlet port, the exit port, and the first imaging window; and
depositing the masking agent onto at least a portion of the second structural member prior to forming the second imaging window; and
removing the masking agent prior to depositing the spacer onto the first electron transparent member.

23. The method of claim 19, wherein:
patterning is performed using a technique selected from photolithography, wet etching, or dry etching.

* * * * *